(12) United States Patent
Wei

(10) Patent No.: US 10,529,888 B2
(45) Date of Patent: Jan. 7, 2020

(54) INDEPENDENTLY-DRIVEN FILM SEPARATION MECHANISM

(71) Applicant: Beijing Chuangyu Technology Co., Ltd, Beijing (CN)

(72) Inventor: Min Wei, Beijing (CN)

(73) Assignee: DONGTAI HI-TECH EQUIPMENT TECHNOLOGY CO., LTD, Beijing (CN)

( * ) Notice: Subject to any disclaimer, the term of this patent is extended or adjusted under 35 U.S.C. 154(b) by 0 days.

(21) Appl. No.: 16/019,582

(22) Filed: Jun. 27, 2018

(65) Prior Publication Data

US 2019/0165203 A1 May 30, 2019

(30) Foreign Application Priority Data

Nov. 29, 2017 (CN) .......................... 2017 1 1228899

(51) Int. Cl.
  *B32B 43/00* (2006.01)
  *H01L 31/18* (2006.01)
  *H01L 21/78* (2006.01)
  *B32B 38/10* (2006.01)

(52) U.S. Cl.
  CPC ...... *H01L 31/1876* (2013.01); *H01L 21/7813* (2013.01); *B32B 38/10* (2013.01); *B32B 43/006* (2013.01); *Y10T 156/1132* (2015.01); *Y10T 156/1944* (2015.01)

(58) Field of Classification Search
  CPC . B32B 38/10; B32B 43/006; Y10T 156/1132; Y10T 156/1944
  USPC ................................................ 156/707, 758
  See application file for complete search history.

(56) References Cited

U.S. PATENT DOCUMENTS

| 5,447,596 A | * | 9/1995 | Hayase | ............... H01L 21/6835 156/701 |
| 5,676,364 A | * | 10/1997 | Shiiki | .................. B65H 3/0816 271/106 |
| 7,670,452 B2 | * | 3/2010 | Heidari | ................... B08B 9/035 156/707 |
| 8,470,129 B1 | * | 6/2013 | Wang | ..................... B32B 38/10 156/705 |

(Continued)

FOREIGN PATENT DOCUMENTS

| CN | 202434555 U | 9/2012 |
| CN | 105655487 A | 6/2016 |

(Continued)

*Primary Examiner* — Mark A Osele
*Assistant Examiner* — Nickolas R Harm
(74) *Attorney, Agent, or Firm* — Gang Yu

(57) ABSTRACT

The present disclosure relates to a technical field of solar cells, and more particularly to an independently-driven film separation mechanism. The separation mechanism includes a mounting platform. A plurality of first suction components for sucking the bottom surfaces of wafers respectively are provided on one side of the mounting platform. Each of the first suction components is corresponding to one of the wafers. The mounting platform is provided with a plurality of second suction components for sucking films respectively, each of the films is provided on a top surface of the corresponding wafer. The first suction components and the second suction components are provided in a one to one correspondence, and a suction direction of each of the plurality of first suction components and a suction direction of each of the plurality of second suction components are opposite.

16 Claims, 2 Drawing Sheets

(56) References Cited

U.S. PATENT DOCUMENTS

| | | | |
|---|---|---|---|
| 8,845,859 B2* | 9/2014 | Ries | H01L 21/67092 156/714 |
| 2005/0150597 A1* | 7/2005 | Henley | B28D 5/00 156/755 |
| 2007/0018358 A1* | 1/2007 | Heidari | B08B 9/035 264/334 |
| 2010/0175828 A1* | 7/2010 | Fan | H01L 21/67144 156/718 |
| 2010/0224320 A1* | 9/2010 | Tsai | G02F 1/1303 156/707 |
| 2010/0263794 A1* | 10/2010 | George | B32B 43/006 156/707 |
| 2011/0198040 A1* | 8/2011 | Ebata | B65H 41/00 156/750 |
| 2011/0266709 A1* | 11/2011 | Song | B82Y 10/00 264/101 |
| 2011/0297771 A1* | 12/2011 | Noda | B32B 43/006 241/65 |
| 2012/0168091 A1* | 7/2012 | Kell | H01L 21/67092 156/707 |
| 2012/0227909 A1* | 9/2012 | Schindler | H01L 21/67132 156/707 |
| 2013/0133838 A1* | 5/2013 | Kim | B32B 37/00 156/707 |
| 2014/0209250 A1* | 7/2014 | Kawagoe | B32B 43/006 156/701 |
| 2015/0059987 A1* | 3/2015 | Kumakura | B32B 43/006 156/714 |
| 2015/0217557 A1* | 8/2015 | Lee | B32B 43/006 156/707 |
| 2015/0319893 A1* | 11/2015 | Ohno | B32B 43/006 156/702 |
| 2016/0159069 A1* | 6/2016 | Huang | B32B 43/006 156/707 |
| 2017/0018450 A1* | 1/2017 | Tang | B05D 1/005 |

FOREIGN PATENT DOCUMENTS

| | | |
|---|---|---|
| CN | 107946407 A | 4/2018 |
| JP | 2003128490 A | 5/2003 |
| JP | 2004079026 A | 3/2004 |
| JP | 2012174742 A | 9/2012 |
| JP | 2013157417 A | 8/2013 |
| JP | 2013207159 A | 10/2013 |
| JP | 2016040099 A | 3/2016 |
| KR | 101731537 B | 4/2017 |

* cited by examiner

INDEPENDENTLY-DRIVEN FILM SEPARATION MECHANISM

TECHNICAL FIELD

The present disclosure relates to a technical field of solar cells, particularly to a independently-driven film separation mechanism, and more particularly to be used in a dedicated wet etching process—an epitaxial lift-off system, applicable to a large-productivity machine table, and capable of separating a plurality of films from a substrate at a time independently, improving the production efficiency and equipment utilization significantly, and meeting the process requirements.

BACKGROUND

At present, a typical wet etching process is as shown in FIG. 1. First, a wafer with a polymer film (e.g., a gallium arsenide wafer) is loaded and placed in a special carrier, and then a manipulator is used to transport the carrier to a process chamber to perform a wet etching process. After the process is completed, the carrier is transported to an unloading position to unload an etched film and wafer. Then, a separation mechanism is used to separate the film and the wafer. Finally, the film and the wafer are unloaded into respective cassettes.

In the above film-from-wafer separation process, an epitaxial lift-off system is generally used. The epitaxial lift-off system is intended to separate a film (e.g., a thin photovoltaic film) from a growing wafer (e.g., a gallium arsenide substrate). The system takes a polymer film fitted to the wafer as an input, and outputs a separate wafer (e.g., a gallium arsenide wafer) and a film adhered to a polymer frame (e.g., a photovoltaic film). The separated film is used for preparing a film solar cell, and the separated wafer or substrate (e.g., a gallium arsenide wafer) can be reused for many times after polishing and cleaning, thereby significantly reducing the cost of thin-film power generation.

Epitaxial lift-off equipment in a gallium arsenide solar cell production line is taken as an example. The bottleneck of the entire equipment is how to complete the separation of a film and a substrate quickly and reliably. In order to obtain a large productivity, in general, there are mainly the following methods:

(1) Two or more sets of manipulators are used. Each of the manipulators separates a film at a time. This method obviously determines to occupy a large space, especially the size of a carrier for transferring the film and the substrate is highly required, and in addition, the coordination between multiple manipulators is also more complicated.

(2) The unloading and separating of multiple films at a time will generally be powered by one separation driving device to simultaneously separate multiple films. For this method, one disadvantage is that when one or several films are separated unsuccessfully during the separation process, the flexibility and fault tolerance of the entire system are not high. Specifically, if the process requires two or three times to retry when the first separation fails, repeated contact will be made for the separated film and substrate. According to the process for manufacturing a gallium arsenide film, such situations are to be avoided as much as possible.

Therefore, it is necessary to design an automated film separation mechanism that can achieve both large productivity and independent drive.

SUMMARY

(1) Technical Problem to be Solved

Some embodiments of the present disclosure provide an independently-driven film separation mechanism, which can separate a plurality of films simultaneously and can drive the separation of each film independently, thereby solving the problem that related film separation equipment cannot achieve both large productivity and independent drive.

(2) Technical Solution

In order to solve the above technical problem, some embodiments of the present disclosure provide an independently-driven film separation mechanism. The separation mechanism includes a mounting platform. A plurality of first suction components for sucking bottom surfaces of wafers respectively are provided on one side of the mounting platform. Each of the plurality of first suction components is corresponding to one of the wafers. The mounting platform is provided with a plurality of second suction components for sucking films respectively, each of the films is provided on a top surface of the corresponding wafer. The first suction components and the second suction components are provided in a one to one correspondence, and a suction direction of each of the plurality of first suction components and a suction direction of each of the plurality of second suction components are opposite. Each of the plurality of second suction components is connected with a driving mechanism and is able to be driven by the corresponding driving mechanism to move up and down. Each of the driving mechanisms is independently provided on the mounting platform.

In an exemplary embodiment, each of the plurality of first suction components is located on a same plane.

In an exemplary embodiment, each of the plurality of first suction components includes at least two vacuum suction cups, and every two adjacent vacuum suction cups are provided at intervals and are provided on a same side of the mounting platform through a mechanical arm respectively. In exemplary embodiment, the mechanical arm is a vacuum fork.

In an exemplary embodiment, a top surface of the mechanical arm is used for mounting the first suction component, and an end portion of the mechanical arm is connected with the mounting platform.

There are two solutions for setting the driving mechanism.

First: each of the driving mechanisms includes a connecting rod, a bearing, a first rotating shaft, and a motor with a second rotating shaft, the bearing is provided on the mounting platform, and the first rotating shaft penetrates through the bearing and is fixedly connected with an inner ring of the bearing; one end of the connecting rod is connected with the corresponding second suction component, and the other end of the connecting rod is fixedly sleeved on a periphery of the first rotating shaft; the first rotating shaft is sleeved with a first gear; and the second rotating shaft is sleeved with a second gear meshed with the first gear.

In an exemplary embodiment, first rotating shafts comprised in respective driving mechanisms are coaxial.

In an exemplary embodiment, each of the first rotating shafts comprised in respective driving mechanisms is perpendicular to the corresponding connecting rod.

Second: each of the second suction components is connected with the driving mechanism through a connecting rod; one end of the connection rod is connected with the corresponding second suction component, and the other end of the connection rod is fixedly sleeved on a periphery of a rotating shaft of the driving mechanism; and the connecting rod rotates around the rotating shaft under the drive of the driving mechanism.

In an exemplary embodiment, each of the plurality of first suction components and the second suction components are vacuum suction cups, and each of the vacuum suction cups is connected with a vacuum generator through a hose.

In an exemplary embodiment, the film separation mechanism further includes a sliding rail, and the mounting platform is slidably provided on the sliding rail. In an exemplary embodiment, a bottom of the mounting platform is provided with a sliding groove in sliding fit with the sliding rail.

(3) Beneficial Effect

The above technical solution of some exemplary embodiments of the present disclosure has the following beneficial effects:

1. The film separation mechanism of some exemplary embodiments of the present disclosure is provided with a plurality of first suction components and a plurality of second suction components. Each of the second suction components is connected with a driving mechanism, and can be driven by the driving mechanism to move up and down. In use, the first suction component is first placed on a bottom surface of the corresponding wafer, the second suction component is placed on a surface of the corresponding film, and because a suction force of the first suction component is opposite to a suction force of the second suction component and the second suction component is driven to move up by the driving mechanism, so that the film is torn away from the wafer gradually. Since the first suction component and the second suction component are in multiple groups, the film separation mechanism can automatically separate a plurality of films, and thus is convenient, rapid, high in production efficiency and large in productivity. Since each driving mechanism is independently provided, the separation or repeated separation of each film can be performed independently without affecting each other. Therefore, the technical problem that related film separation equipment cannot achieve both large productivity and Independent drive is solved. The separation mechanism has high flexibility in the separation of films, and therefore has a strong application value and promotion significance in a field of solar cell preparation.

2. Each of the first suction components in some exemplary embodiments of the present disclosure is located on the same plane, so that various mechanical arms can be replaced at the bottoms of the wafers simultaneously by moving the mounting platform once, thereby further improving the working efficiency.

3. The driving mechanism in some exemplary embodiments of the present disclosure uses the rotating shaft to drive the rotation of the second suction component, thereby further improving the degree of automation of the work. Moreover, the structure is simple, the operation is convenient, and it is easy to mount and promote.

4. The sliding rail provided in some exemplary embodiments of the present disclosure enables the mounting platform and the driving mechanism to freely move within a wider range, so that the separation mechanism can separate films within a wider range, and also facilitates the transportation, subsequent cleaning and the like of the separated film and wafer, thereby further improving the degree of automation and saving manpower.

Figure 1:
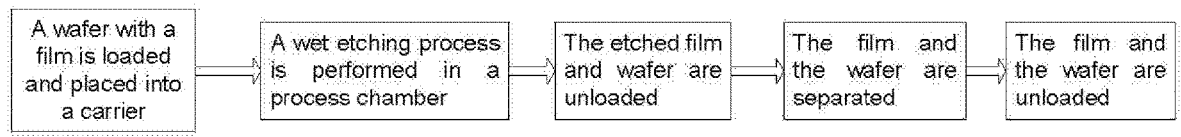
FIG. 1 is a schematic diagram of a related wet etching process at present.

Herein, 1: second suction component; 2: first suction component; 3: first rotating shaft; 4: bearing; 5: motor; 6: sliding rail; 7: mounting platform; 8: first gear; 9: separated wafer; 10: separated film; 11: connecting rod; 12: second rotating shaft; 13: second gear; 14: vacuum fork; A: re-separation of a film which is unsuccessfully separated.

DETAILED DESCRIPTION OF THE EMBODIMENTS

The implementation manners of the present disclosure will be further described in detail below with reference to the accompanying drawings and embodiments. The following embodiments are used to illustrate the present disclosure, but are not used to limit the scope of the present disclosure.

In the description of the present disclosure, unless otherwise specified, "multiple" means two or more. The orientation or positional relationship indicated by the terms "up", "down", "left", "right", "inner", "outer", "front end", "rear end", "head", "tail", etc. is the orientation or positional relationship shown in the drawings, which is merely for the convenience of describing the present disclosure and simplifying the description, and does not indicate or imply that the referred device or element must have a specific orientation and must be constructed and operated in a specific orientation, and thus it cannot be construed as a limitation of the present disclosure. Moreover, the terms "first," "second," "third," etc., are used for descriptive purposes merely, and cannot be construed as indicating or implying relative importance.

In the description of the present disclosure, unless otherwise specified and limited, it should be noted that terms "mounting", "mutual connection" and "connection" should be generally understood. For example, the term may be fixed connection, or detachable connection or integrated connection, may be mechanical connection or electrical connection, may be direct connection, may be indirect connection through an intermediate, or may be internal communication between two elements. A person of ordinary skill in the art may understand specific meanings of the above terms in the present disclosure according to specific situations.

Figure 2:
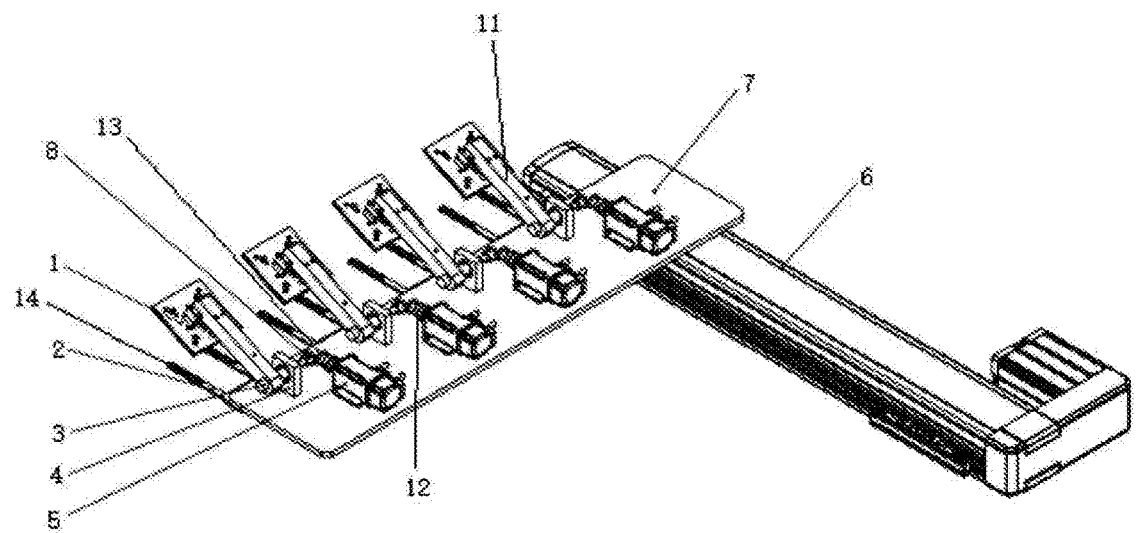
FIG. 2 is a schematic structure diagram of a film separation mechanism according to an embodiment of the present disclosure.
Figure 3:
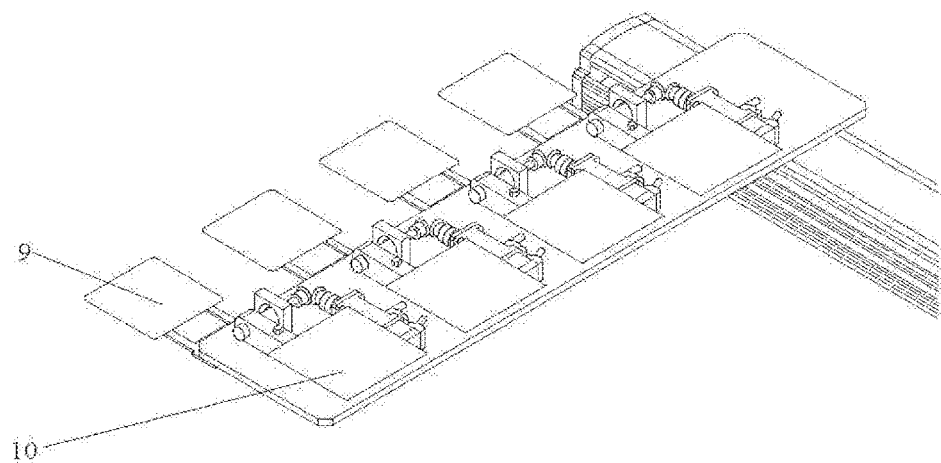
FIG. 3 is a schematic diagram of a state after separation of a film and a wafer according to an embodiment of the present disclosure.
Figure 4:
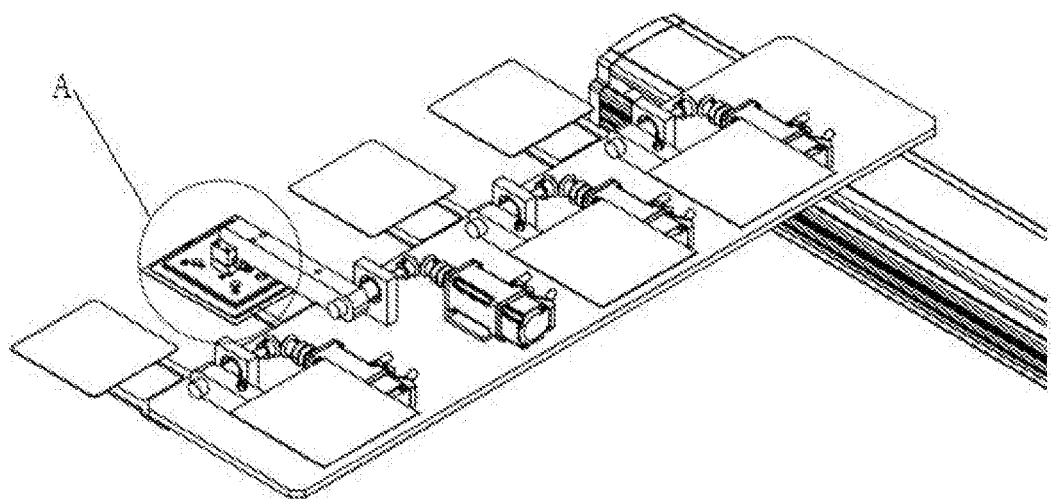
FIG. 4 is a schematic diagram of a state of separately processing a film which is unsuccessfully separated according to an embodiment of the present disclosure.

As shown in FIG. 2 to FIG. 4, some embodiments of the present disclosure provide an independently-driven film separation mechanism, including a mounting platform 7. A plurality of first suction components 2 for sucking bottom surfaces of wafers respectively are provided on one side of the mounting platform 7. Each of the first suction components 2 is corresponding to one of the wafers. The mounting platform 7 is provided with a plurality of second suction components 1 for sucking films respectively, each of the films is provided on a top surface of the corresponding wafer. The first suction components 2 and the second suction components 1 are provided in a one to one correspondence, and a suction direction of each of the plurality of first suction components and a suction direction of each of the plurality of second suction components are opposite. Each of the plurality of second suction components 1 is connected with a driving mechanism and can be driven by the corresponding driving mechanism to move up and down. The independently-driven film separation mechanism comprises a plurality of driving mechanisms, each of the plurality of driving mechanisms is independently provided and is provided on the mounting platform 7.

The first suction components 2 are located on a same plane. Each of the first suction components 2 includes at least two vacuum suction cups, and every two adjacent vacuum suction cups are provided at intervals and are provided on the same side of the mounting platform 7 through a vacuum fork 14 respectively. In an exemplary embodiment, each of the vacuum suction cups is provided on a top surface of the corresponding vacuum fork 14, and an end portion of the vacuum fork 14 is connected with the mounting platform 7.

Each of the driving mechanism includes a connecting rod 11, a bearing 4, a first rotating shaft 3, and a motor 5 with a second rotating shaft 12, the bearing 4 is provided on the mounting platform 7, and the first rotating shaft 3 penetrates through the bearing 4 and is fixedly connected with an inner ring of the bearing 4; one end of the connecting rod 11 is connected with the second suction component 1, and the other end of the connecting rod 11 is fixedly sleeved on a periphery of the first rotating shaft 3; the first rotating shaft 3 is sleeved with a first gear 8; and the second rotating shaft 12 is sleeved with a second gear 13 meshed with the first gear 8. In an exemplary embodiment, the first rotating shaft 3 is perpendicular to the connecting rod 11, and the first rotating shafts 3 comprised in respective driving mechanisms are coaxial.

In an exemplary embodiment, the second suction component 1 is the same as the first suction component 2, which is also a vacuum suction cup, and the vacuum suction cup is connected with a vacuum generator through a hose. The film separation mechanism in an exemplary embodiment further includes a sliding rail 6, and the mounting platform 7 is slidably provided on the sliding rail 6. In an exemplary implementation, a bottom of the mounting platform 7 is provided with a sliding groove, and the sliding groove is matched with the sliding rail 6.

In addition, in the film separation mechanism of the exemplary embodiment, the number of films that can be processed at a time is two or more, and it needs to be the same as the number of lines in a carrier. This can ensure that a layer of processed solar film substrate is unloaded at a time. The driving manner of the separation mechanism is not limited to the motor 5, and other manners such as a worm gear or a rotary cylinder may also be used.

The working process of the independently-driven film separation mechanism of the exemplary embodiment is as follows: each motor 5 drives the rotation of the respective second rotating shaft 12, and the second rotating shaft 12 drives the first rotating shaft 3 to rotate through gear meshing, thereby sequentially driving the connecting rod 11 and the second suction component 1 to rotate up and down, and maintaining the second suction component 1 and the corresponding first suction component 2 at a certain angle (for example, 10°); the entire mounting platform 7 moves along the sliding rail 6 to an unloading position carrier (not shown In the figures), and the vacuum fork 14 is placed at a bottom of the wafer, so that the first suction component 2 sucks the wafer; the second rotating shaft 12 continues to rotate, and drives the second suction component 1 to continue to move down until the second suction component 1 presses the processed film, and the vacuum generator is opened to start the vacuum suction function of the first suction component 2 and the second suction component 1; the entire mounting platform 7 continues to move along the sliding rail 6, and the processed film and wafer are taken out of the carrier to move to a separation position for film separation; since the first suction component 2 sucks a bottom surface of the wafer, the second suction component 1 sucks a surface of the film, the suction direction of the plurality of first suction component 2 and the suction direction of the plurality of second suction component 1 are opposite, the motor 5 drives the second rotating shaft 12 to rotate reversely, and the connecting rod 11 and the second suction component 1 are finally driven in sequence to reversely rotate, thereby gradually tearing the film away from the top surface of the wafer. Finally, the separation mechanism successfully achieves separation of the film 10 and the wafer 9, as shown in FIG. 3.

In the separation process, when one of the films is unsuccessfully separated, the second film on the left is not separated successfully as shown in FIG. 4, and the second film may be provide to be separated in a program, as shown in part A of FIG. 4. According to the process or actual situations, the separation operation can be repeated for 2 or 3 times. In the separation process, if deionized water is needed, the motor 5 and the gear part need to be specially protected, for example, a protective plate is added right above.

From the foregoing, it can be seen that the film separation mechanism of the present disclosure is provided with a first suction component and a second suction component. Each of the second suction components is connected with a driving mechanism, and can be driven by the corresponding driving mechanism to move up and down. In use, the first suction component is first placed on the bottom surface of the corresponding wafer, the second suction component is placed on the surface of the corresponding film, because a suction force of the first suction component is opposite to a suction force of the second suction component and the second suction component is driven to move up by the driving mechanism, so that the film is torn away from the wafer gradually. Since the first suction component and the second suction component are in multiple groups, the film separation mechanism can automatically separate a plurality of films, and thus is convenient, rapid, high in production efficiency and large in productivity. Since each driving mechanism is independently provided, the separation or repeated separation of each film can be performed independently without affecting each other. Therefore, the technical problem that related film separation equipment cannot achieve both large productivity and independent drive is solved. The separation mechanism has high flexibility in the separation of films, and therefore has a strong application value and promotion significance in a field of solar cell preparation.

In an exemplary embodiment, the first suction components are located on the same plane, so that various mechanical arms can be replaced at bottoms of the wafers simultaneously by moving the mounting platform once, thereby further improving the working efficiency. The driving mechanism of the exemplary embodiment uses the rotating shaft to drive the rotation of the corresponding second suction component, thereby further improving the degree of automation of the work. Moreover, the structure is simple, the operation is convenient, and it is easy to mount and promote. The sliding rail provided in the exemplary embodiment enables the mounting platform and the driving mechanism to freely move within a wider range, so that the separation mechanism can separate films within a wider range, and also facilitates the transportation, subsequent cleaning and the like of the separated film and wafer, thereby further improving the degree of automation and saving manpower.

In summary, in the film separation mechanism of the present embodiment, a plurality of independent separation mechanisms are integrated together, and successfully achieves automatic separation of a film and a wafer (e.g., a gallium arsenide solar substrate), which is convenient and rapid, and increases productivity; and the separation mechanism corresponding to each film has an independent driving mechanism, so that a film that is unsuccessfully separated can be repeatedly separated and processed separately according to the process requirements, and the number of times of processing the film that is unsuccessfully separated can be arbitrarily set, thereby improving the flexibility and fault tolerance of film separation. Moreover, the film separation mechanism has a simple structure, is easy to operate and maintain, is easy to popularize, has low cost, and is easy to implement.

The embodiments of the present disclosure are given by way of illustration and description, but are not exhaustive or limit the present disclosure to the forms disclosed. Many modifications and variations will be apparent to those of ordinary skill in the art. The embodiments are chosen and described in order to best explain the principles of the present disclosure and the practical application, and to enable others of ordinary skill in the art to understand the present disclosure so as to design various embodiments with various modifications for specific purposes.

What is claimed is:

1. An independently-driven film separation mechanism, comprising a mounting platform, wherein a plurality of first suction components for sucking bottom surfaces of wafers respectively are provided on one side of the mounting platform; each of the plurality of first suction components is corresponding to one of the wafers; the mounting platform is provided with a plurality of second suction components for sucking films respectively, each of the films is provided on a top surface of the corresponding wafer; the first suction components and the second suction components are provided in a one to one correspondence, and a suction direction of each of the plurality of first suction components and a suction direction of each of the plurality of second suction components are opposite; each of the plurality of second suction components is connected with a respective one driving mechanism and is able to be driven by the corresponding driving mechanism to move up and down; and the independently-driven film separation mechanism comprises a plurality of driving mechanisms, each of the plurality of driving mechanisms is independently provided on the mounting platform.

2. The independently-driven film separation mechanism as claimed in claim 1, wherein each of the plurality of first suction components is located on a same plane.

3. The independently-driven film separation mechanism as claimed in claim 2, wherein each of the plurality of first suction components comprises at least two vacuum suction cups, and every two adjacent vacuum suction cups are provided at intervals and are provided on a same side of the mounting platform through a mechanical arm respectively.

4. The independently-driven film separation mechanism as claimed in claim 3, wherein a top surface of the mechanical arm is used for mounting the first suction component, and an end portion of the mechanical arm is connected with the mounting platform.

5. The independently-driven film separation mechanism as claimed in claim 4, wherein each of the driving mechanisms comprises a connecting rod, a bearing, a first rotating shaft, and a motor with a second rotating shaft, the bearing is provided on the mounting platform, and the first rotating shaft penetrates through the bearing and is fixedly connected with an inner ring of the bearing; one end of the connecting rod is connected with the corresponding second suction component, and the other end of the connecting rod is fixedly sleeved on a periphery of the first rotating shaft; the first rotating shaft is sleeved with a first gear; and the second rotating shaft is sleeved with a second gear meshed with the first gear.

6. The independently-driven film separation mechanism as claimed in claim 4, wherein each of the second suction components is connected with the driving mechanism through a connecting rod; one end of the connection rod is connected with the corresponding second suction component, and the other end of the connection rod is fixedly sleeved on a periphery of a rotating shaft of the driving mechanism; and the connecting rod rotates around the rotating shaft under a drive of the driving mechanism.

7. The independently-driven film separation mechanism as claimed in claim 3, wherein each of the driving mechanisms comprises a connecting rod, a bearing, a first rotating shaft, and a motor with a second rotating shaft, the bearing is provided on the mounting platform, and the first rotating shaft penetrates through the bearing and is fixedly connected with an inner ring of the bearing; one end of the connecting rod is connected with the corresponding second suction component, and the other end of the connecting rod is fixedly sleeved on a periphery of the first rotating shaft; the first rotating shaft is sleeved with a first gear; and the second rotating shaft is sleeved with a second gear meshed with the first gear.

8. The independently-driven film separation mechanism as claimed in claim 3, wherein each of the plurality of second suction components is connected with the driving mechanism through a connecting rod; one end of the connection rod is connected with the corresponding second suction component, and the other end of the connection rod is fixedly sleeved on a periphery of a rotating shaft of the driving mechanism; and the connecting rod rotates around the rotating shaft under a drive of the driving mechanism.

9. The independently-driven film separation mechanism as claimed in claim 2, wherein each of the driving mechanisms comprises a connecting rod, a bearing, a first rotating shaft, and a motor with a second rotating shaft, the bearing is provided on the mounting platform, and the first rotating shaft penetrates through the bearing and is fixedly connected with an inner ring of the bearing; one end of the connecting rod is connected with the corresponding second suction component, and the other end of the connecting rod is fixedly sleeved on a periphery of the first rotating shaft; the first rotating shaft is sleeved with a first gear; and the second rotating shaft is sleeved with a second gear meshed with the first gear.

10. The independently-driven film separation mechanism as claimed in claim 2, wherein each of the plurality of second suction components is connected with the driving mechanism through a connecting rod; one end of the connection rod is connected with the corresponding second suction component, and the other end of the connection rod is fixedly sleeved on a periphery of a rotating shaft of the driving mechanism; and the connecting rod rotates around the rotating shaft under a drive of the driving mechanism.

11. The independently-driven film separation mechanism as claimed in claim 1, wherein each of the driving mechanisms comprises a connecting rod, a bearing, a first rotating shaft, and a motor with a second rotating shaft, the bearing is provided on the mounting platform, and the first rotating shaft penetrates through the bearing and is fixedly connected with an inner ring of the bearing; one end of the connecting rod is connected with the corresponding second suction component, and the other end of the connecting rod is fixedly sleeved on a periphery of the first rotating shaft; the first rotating shaft is sleeved with a first gear; and the second rotating shaft is sleeved with a second gear meshed with the first gear.

12. The independently-driven film separation mechanism as claimed in claim 11, wherein first rotating shafts comprised in respective driving mechanisms are coaxial.

13. The independently-driven film separation mechanism as claimed in claim 11, wherein each of the first rotating shafts comprised in the driving mechanisms is perpendicular to the corresponding connecting rod.

14. The independently-driven film separation mechanism as claimed in claim 1, wherein each of the plurality of second suction components is connected with the driving mechanism through a connecting rod; one end of the connection rod is connected with the corresponding second suction component, and the other end of the connection rod is fixedly sleeved on a periphery of a rotating shaft of the driving mechanism; and the connecting rod rotates around the rotating shaft under a drive of the driving mechanism.

15. The independently-driven film separation mechanism as claimed in claim 1, wherein each of the plurality of first suction components and the second suction components are vacuum suction cups, and each of the vacuum suction cups is connected with a vacuum generator through a hose.

16. The independently-driven film separation mechanism as claimed in claim 1, further comprising a sliding rail, wherein the mounting platform is slidably provided on the sliding rail.

* * * * *